United States Patent [19]
Litman et al.

[11] Patent Number: 5,466,940
[45] Date of Patent: Nov. 14, 1995

[54] ELECTRON DETECTOR WITH HIGH BACKSCATTERED ELECTRON ACCEPTANCE FOR PARTICLE BEAM APPARATUS

[75] Inventors: Alon Litman, Nes Ziona; Alexander Goldenstein, Holon; Steven R. Rogers, Emek Sorek, all of Israel

[73] Assignee: Opal Technologies Ltd., Nes Ziona, Israel

[21] Appl. No.: 262,285

[22] Filed: Jun. 20, 1994

[51] Int. Cl.$^6$ ............................................. H01J 37/244
[52] U.S. Cl. .................................... 250/397; 250/305
[58] Field of Search ................................ 250/397, 305

[56] References Cited

U.S. PATENT DOCUMENTS

| 3,896,308 | 7/1975 | Venables et al. | 250/397 |
| 4,958,079 | 9/1990 | Gray | 250/305 |

Primary Examiner—Jack L. Berman
Attorney, Agent, or Firm—Mark M. Friedman

[57] ABSTRACT

An electron detector for use in particle beam apparatus, providing particularly high acceptance of backscattered electrons. The electron detector includes an electron multiplier for detecting electrons and an electrode deployed between the electron multiplier and a specimen. The electrode is biased at a negative potential with respect to the specimen and also with respect to the electron multiplier.

29 Claims, 5 Drawing Sheets

ELECTRON DETECTOR WITH HIGH BACKSCATTERED ELECTRON ACCEPTANCE FOR PARTICLE BEAM APPARATUS

FIELD AND BACKGROUND OF THE INVENTION

The present invention relates to particle beam apparatus in general and in particular to electron multiplier detectors with high backscattered electron acceptance.

Particle beam apparatus, such as the scanning electron microscope, electron beam lithography equipment, ion beam lithography equipment, and the like are used in a wide range of applications. In principle, particle beam apparatus scans the surface of a specimen with an energetic particle beam. The impact of the particle beam on the surface of the specimen causes a release of electrons. In accordance with accepted nomenclature, electrons released with energies exceeding 50 eV are referred to as backscattered electrons (BSEs) while electrons released with energies of 50 eV or less are referred to as secondary electrons (SEs). For a particle beam of approximately 1000 eV, the released electrons are typically divided equally between BSEs and SEs. It is well known that backscattered electrons contain material contrast information while secondary electrons contain topographical information. Particular applications of particle beam apparatus which require high backscattered electron acceptance include inspection of VLSI devices, viewing the bottoms of deep trenches and contact holes in semiconductor materials, and the like.

Early implementations of electron detectors for detecting backscattered electrons are described in a book entitled "Image Formation in Low Voltage Scanning Electron Microscopy" by L. Reimer in SPIE Optical Engineering Press, Bellingham, Wash., U.S.A., 1993, pp. 31–40 which is incorporated by reference as if it were fully set forth herein. Broadly speaking, the electron detectors include a conversion plate for absorbing BSEs and emitting SEs which are, in turn, detected by an Everhart-Thornley scintillator detector. These electron detectors suffer from limited BSE acceptance because the scintillators are typically maintained at a potential of 5 to 10 kV requiring that the detectors be positioned far from the particle beam to prevent large beam deflections and aberrations.

Later implementations of electron detectors for detecting backscattered electrons from a specimen utilize electron detectors fashioned as a microchannel plate electron multiplier or a solid-state electron multiplier. An apparatus including such an electron detector is disclosed in U.S. Pat. No. 4,933,552 to Lee entitled "Inspection System Utilizing Retarding Field Back Scattered Electron Collection". Here, a particle beam is columnated and directed through a bias plate and annular detector at a specimen held at a negative bias with respect to the plate and the detector. The negative bias is selected so that the incident beam strikes the specimen at the crossover energy so that minimum specimen charging occurs. The negative bias also effects spatial separation between SEs and those BSEs having a large transverse velocity component in the plane of the detector.

This arrangement suffers from two main disadvantages. First, the detector has low acceptance of BSEs with small transverse velocity components which, in the case of a particle beam directed at normal incidence to a specimen, can be a substantial fraction of the total BSE yield. In fact, in this instance, the transverse velocity distribution of the BSEs emitted by the specimen has its peak value at zero transverse velocity. And second, in practice, it is difficult to maintain highly insulating specimens at a uniform negative potential while scanning them with a charged particle beam.

Other implementations utilizing microchannel plate or solid-state electron multipliers are described in an article entitled "Low-profile high efficiency microchannel plate detector system for scanning electron microscopy applications," by Michael T. Postek and William J. Keery in Reviews of Scientific Instruments, vol. 61, no. 6, June, 1990, pp. 1648–1657 which is incorporated by reference as if it were fully set forth herein. Here, the particle beam passes through a beam shielding tube on its way to the specimen for preventing deviation and aberration. Hence, the focal point of the beam is directly under the beam shielding tube. When used as a BSE detector, the surface of the electron multiplier is maintained at a potential of −50 V or less with respect to the specimen which is typically grounded.

This implementation also suffers from low BSE acceptance for a number of reasons. First, the electron multiplier only detects BSEs with energies greater than its own potential. Second, many of the BSEs, referred to hereinbelow as Type A BSEs, fail to be detected because they impinge between the active channels of the electron multiplier. And finally, a smaller number of BSEs, referred to hereinbelow as Type B BSEs, are also not detected because they impinge on the beam shielding tube.

These undetected BSEs cause a considerable deterioration in the quality of images rendered by the electron detector because they constitute a meaningful percentage of the total yield of BSEs. As described in the article entitled "Areal detection efficiency of channel electron multiplier arrays" by J. A. Panitz and J. A. Foesch in Rev. Sci Instrum. Vol 47, No. 1, January 1976, the areal detection efficiency of a microchannel plate electron multiplier is typically only about 60%. Thus, Type A BSEs constitute approximately 40% of the total BSE yield. Type B BSEs are usually less numerous, but they often constitute a large fraction of the BSEs in applications where electron emission by the specimen is highly collimated along the particle beam axis.

There is therefore a need for an electron detector having a high backscattered acceptance without suffering from the aforementioned deficiencies.

SUMMARY OF THE INVENTION

The main object of the present invention is to provide an electron detector having a high backscattered electron acceptance.

Hence, according to a first aspect of the present invention, there is provided an electron detector for detecting backscattered electrons emitted from a specimen, the electron detector comprising: (a) an electron multiplier for detecting electrons; and (b) an electrode deployed between the electron multiplier and the specimen, the electrode being biased at a negative potential with respect to the specimen; the electron detector characterized in that the electrode is biased at a negative potential also with respect to the electron multiplier.

According to further features of the present invention, the electron multiplier can be biased at a positive potential with respect to the specimen, at substantially the same potential as the specimen or at a negative potential with respect to the specimen depending on the particular application at hand.

According to still further features, the electron multiplier is either a microchannel plate electron multiplier or a solid-state electron multiplier. Furthermore, the electrode has an aperture with a fixed diameter selected for passing therethrough a solid angle of backscattered electrons for impingement on said front surface such that the electrode acts as a spatial filter for ensuring that only electrons impinging within a given solid angle of the particle beam axis will pass therethrough.

According to yet still further features of the present invention, the electron detector includes a beam shielding tube for the passage therethrough of a particle beam provided by a particle beam apparatus toward the specimen. The beam shielding tube can be fashioned with a beveled end and/or can be fabricated from a material having a high secondary electron emission coefficient.

Still further, the electron detector can include a second electrode interposed between the first electrode and the specimen for shielding the specimen from the electric field generated by the first electrode by acting as a Faraday cage.

There is also provided according to a second aspect of the present invention, particle beam apparatus including an electron detector for detecting backscattered electrons emitted from a specimen, the electron detector comprising: (a) an electron multiplier for detecting electrons; and (b) an electrode deployed between the electron multiplier and the specimen, the electrode being biased at a negative potential with respect to the specimen; the electron detector characterized in that the electrode is biased at a negative potential also with respect to the electron multiplier.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of an electron detector having a high backscattered electron acceptance for particle beam apparatus.

The principles and operation of the electron detector according to the present invention may be better understood with reference to the drawings and the accompanying description.

Figure 1:
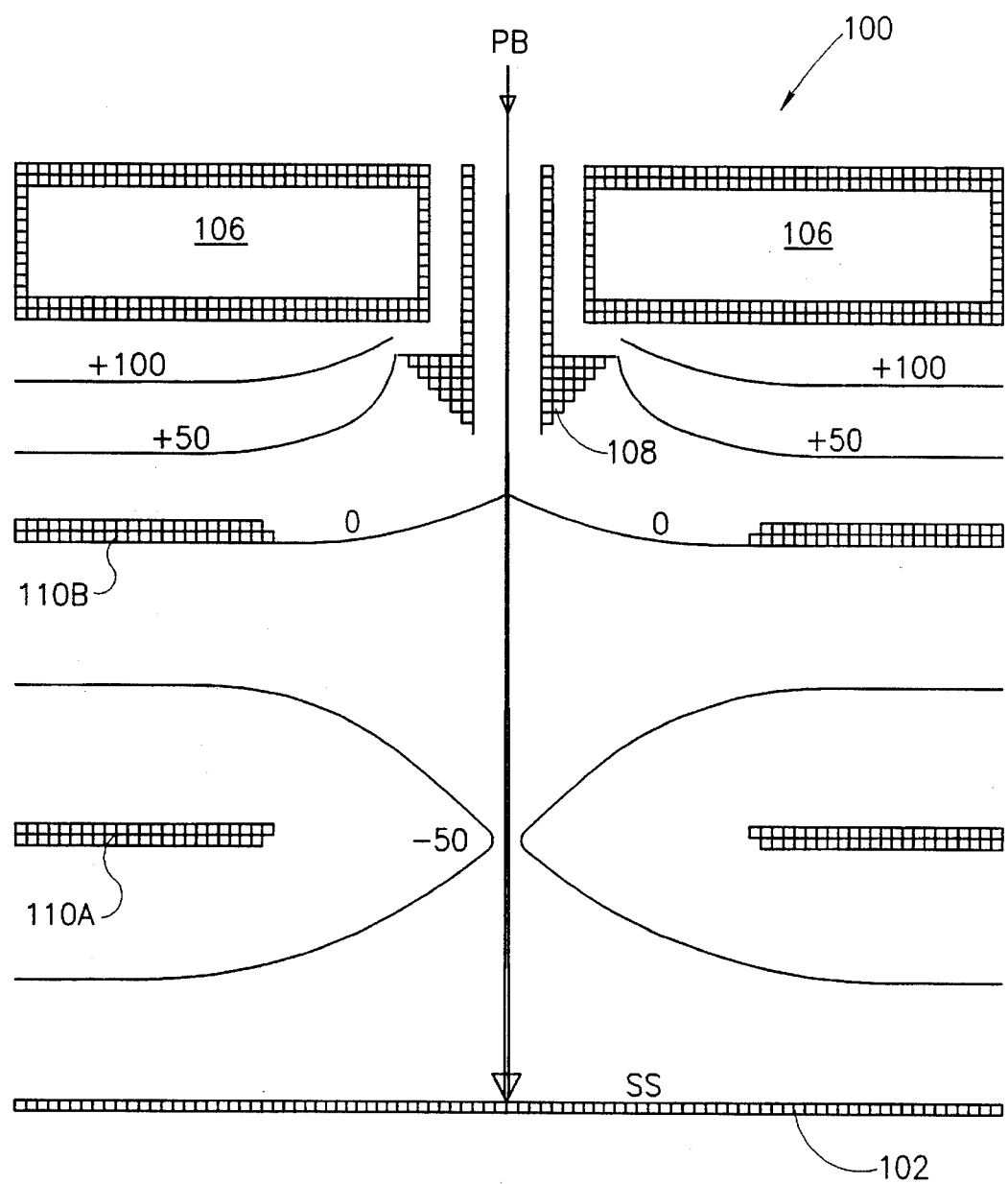
FIG. 1 is a schematic view of a preferred embodiment of an electron detector having a high backscattered electron acceptance deployed exterior to the optical column of particle beam apparatus.
Figure 6:
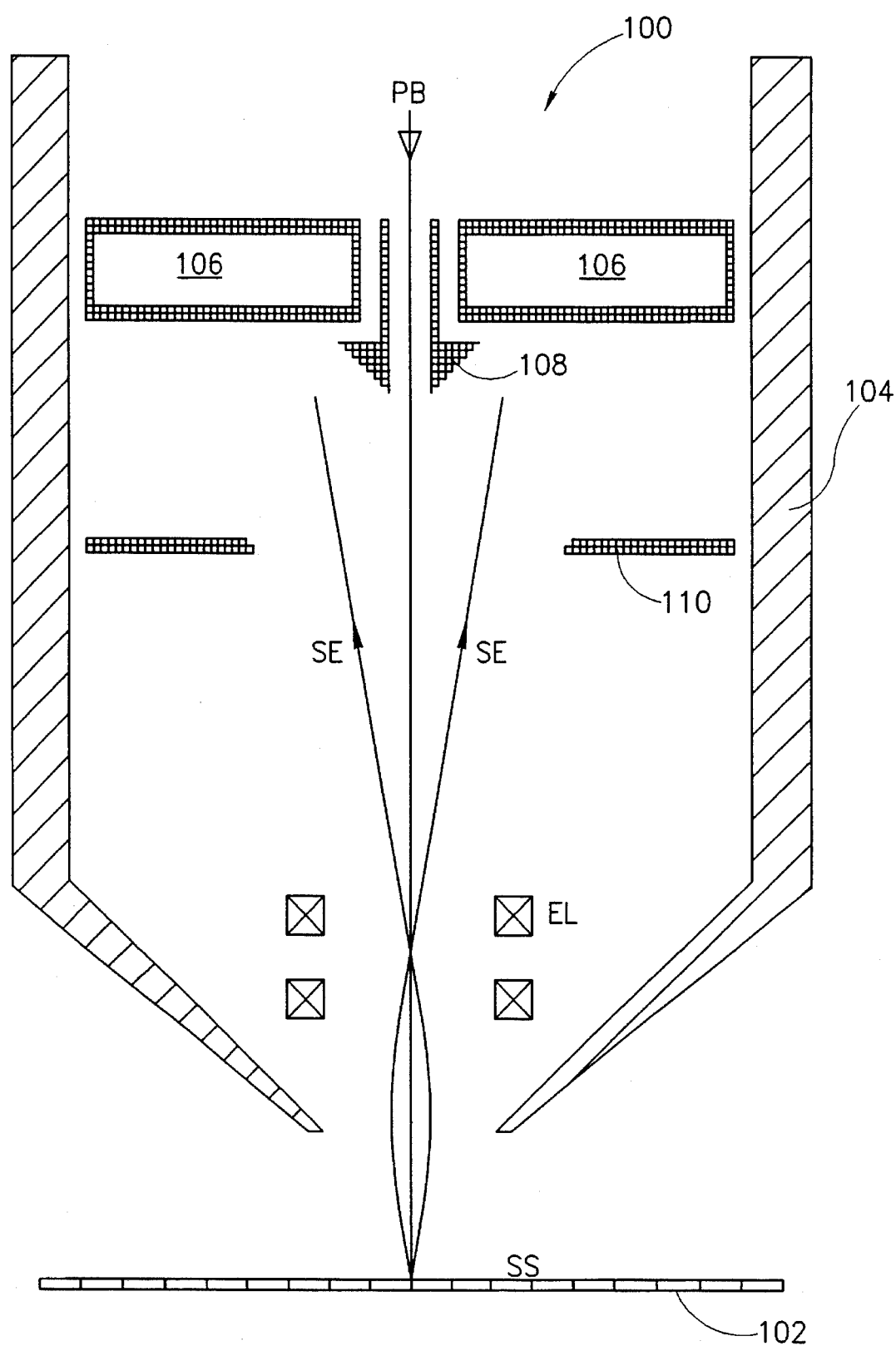
FIG. 6 is a schematic view of an electron detector deployed within the optical column of particle beam apparatus.

Referring now to the drawings, FIG. 1 shows the preferred embodiment of an electron detector, generally designated 100, constructed and operative according to the teachings of the present invention, for detecting backscattered electrons denoted BSE emitted by a specimen 102 through the action of a particle beam PB provided by a particle beam apparatus 104. In the configuration shown, electron detector 100 is deployed exterior to particle beam apparatus 104 while, in an alternative configuration shown in FIG. 6, electron detector 100 is deployed within the optical column of particle beam apparatus 104.

In principle, particle beam apparatus 104 provides a particle beam PB having energies typically greater than 200 eV for evaluating top surface SS of specimen 102. Particle beam PB impinges on surface SS of specimen 102 and causes electrons to be released therefrom. The released electrons have energies ranging from zero to the PB kinetic energy. In accordance with accepted nomenclature, the electrons released with energies exceeding 50 eV are referred to as backscattered electrons (BSEs) while the electrons released with energies of 50 eV or less are referred to as secondary electrons (SEs).

Electron detector 100 includes a generally annular electron multiplier 106 and a beam shielding tube 108 passing through electron multiplier 106 for preventing deviation of particle beam PB on its way to specimen 102 from particle beam apparatus 104. Electron multiplier 106 can be fabricated as a microchannel electron multiplier, a solid-state electron multiplier, and the like. It is a particular feature of the present invention, that electron detector 100 also includes a generally annular electrode 110 having an aperture EA for ensuring that electron detector 100 detects not only those backscattered electrons which impinge on the active area of electron multiplier 106 but also those backscattered electrons which impinge on the inactive area of electron multiplier 106 referred to as Type A BSEs and those backscattered electrons which impinge on beam shielding tube 108 referred to as Type B BSEs.

This is achieved by electron detector 100 detecting the low energy secondary electrons released when the Type A BSEs impinge on the inactive area of electron multiplier 106 and the Type B BSEs impinge on beam shielding tube 108. Several conditions are conducive to generating the environment in which secondary electrons released by electron multiplier 106 and beam shielding tube 108 are detected by electron detector 100. First, the front surface of electrode multiplier 106 is required to be biased at a positive potential with respect to electrode 110. Second, the front surface of electron multiplier 106 is preferably biased at a positive potential with respect to beam shielding tube 108. And third, beam shielding tube 108 is preferably biased at substantially the same potential as or at a positive potential with respect to electrode 110.

However, in accordance with the motivation behind electron detector 100, electron detector 100 requires an energy filter for retarding secondary electrons emitted by specimen 102 such that only electrons above a certain threshold, or in other words, the backscattered electrons reach electron multiplier 106. This condition is provided by biasing electrode 110 at a negative potential of sufficient magnitude that the potential at the center of aperture EA is −50 V or less with respect to specimen 102. It should be noted that the front surface of electron multiplier 106 can be biased at a positive potential with respect to specimen 102, at substantially the same potential as specimen 102 or at a negative potential with respect to specimen 102 depending on the particular application in hand.

Figure 2:
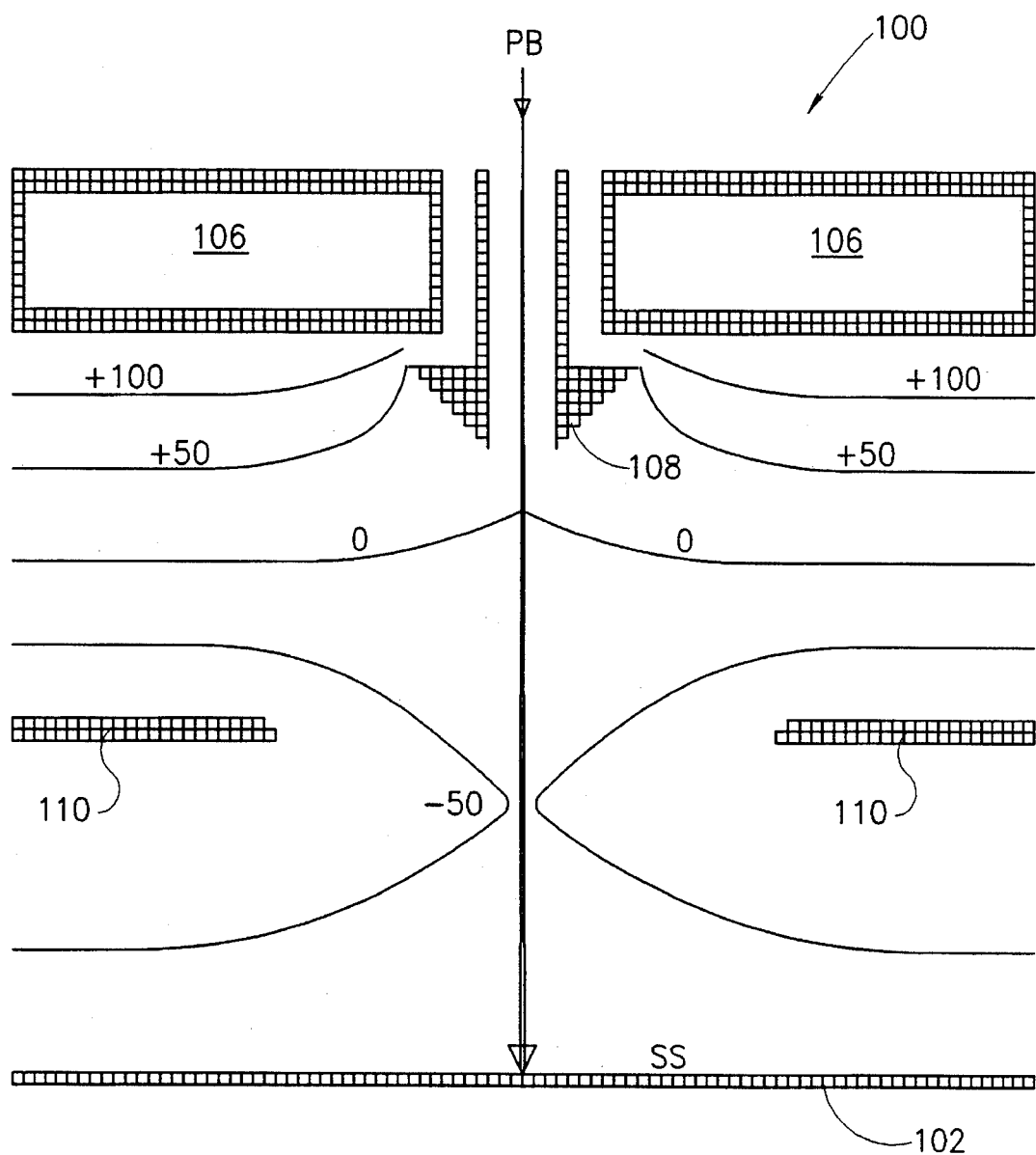
FIG. 2 illustrates a representative electric potential field within the environment of the electron detector.

Turning now to FIG. 2, for the sake of exposition, the electric potential distribution within electron detector 100 is shown for representative voltages in which electrode 110 is at a voltage of −150 V, the front surface of electron multiplier 106 is at a voltage of +150 V, and both surface SS of specimen 102 and beam shielding tube 108 are at a voltage of 0 V. It should be noted that a wide range of voltages and voltage differentials can be equally well employed as long as the relative voltage biases are as described hereinabove.

The electric field prevailing within electron detector 100 achieves the required effects as follows. First, electrons leaving surface SS require energies in excess of 50 eV to cross the aperture EA of electrode 110 such that electrode 110 acts as an energy filter enabling only the passage of electrons defined as BSEs to reach electron multiplier 106. Incidentally, the trajectories of BSEs, typically having energies of several hundred electron volts are almost undeflected as they pass through aperture EA of electrode 110. Second, electrode 110 also acts as a spatial filter of the electrons released from specimen 102 through fashioning the diameter of aperture EA such that only electrons impinging within a given solid angle of the particle beam axis will pass therethrough.

Figure 3:
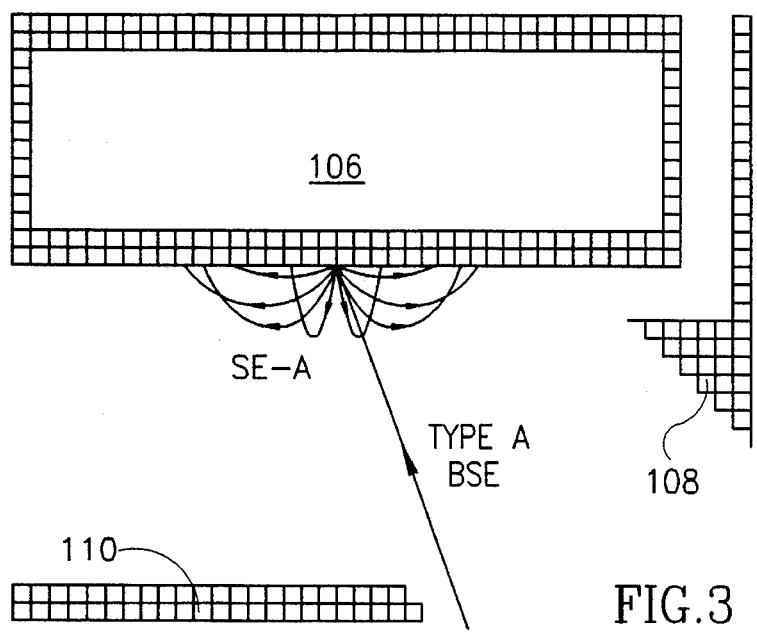
FIG. 3 illustrates the trajectories of secondary electrons produced by Type A BSEs impinging on inactive areas of the electron multiplier.
Figure 4:
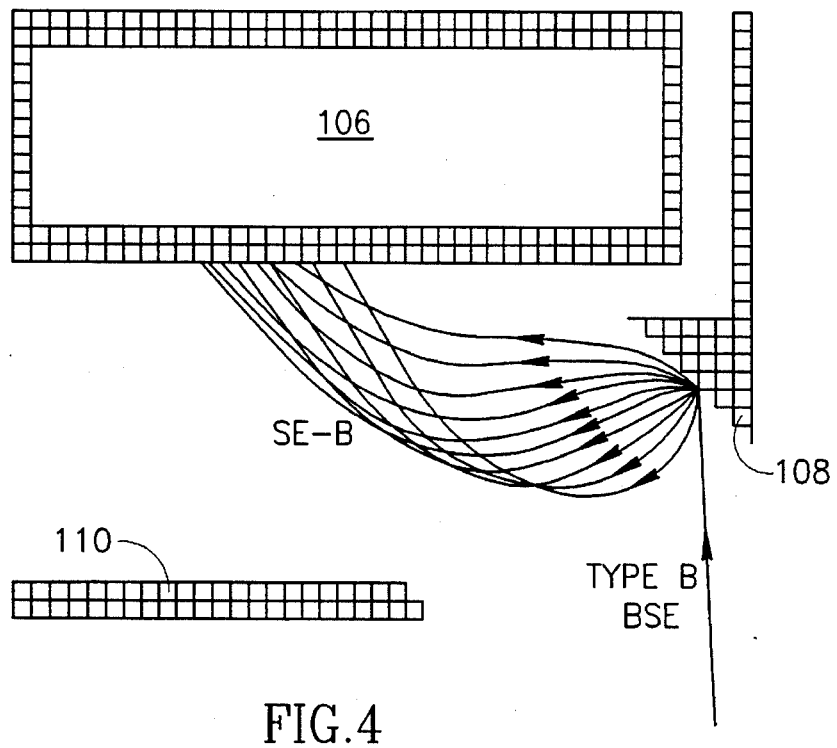
FIG. 4 illustrates the trajectories of secondary electrons produced by Type B BSEs impinging on the beam shielding tube of the electron detector.

And finally, as will be explained now with reference to FIGS. 3 and 4, the electric field facilitates the detection of the secondary electrons produced by the Type A BSEs and the Type B BSEs when they impinge on the inactive area of the front surface of electron multiplier 106 and beam shielding tube 108, respectively. As shown in FIG. 3, the electric field inverts the trajectories of the secondary electrons denoted SE-A released from the front surface of electron multiplier 106 through impingement of Type A BSEs. While, in a similar fashion as shown in FIG. 4, the electric field bends the trajectories of the secondary electrons denoted SE-B released from beam shielding tube 108 through impingement of Type B BSEs.

It is another feature of the present invention that the probability of detecting Type B BSEs is significantly increased by proper design of beam shielding tube 108. In particular, the emission of secondary electrons by impingement of Type B BSEs on beam shielding tube 108 is enhanced by beveling its end causing the maximum of the Lambertian angular distribution of the secondary electrons to be inclined toward the direction of electron multiplier 106. Alternatively, beam shielding tube 108 can be fabricated from material with a particularly high secondary electron emission coefficient. Such materials have been widely studied in connection with photomultiplier devices and are described in detail in the article entitled "Secondary Electron Emission" by Kenneth G. McKay in L. Martin (ed.), Advances in Electronics, vol. Academic Press Inc. New York, N.Y., 1948, pp. 65–130 which is incorporated by reference as if it were fully set forth herein.

Figure 5:
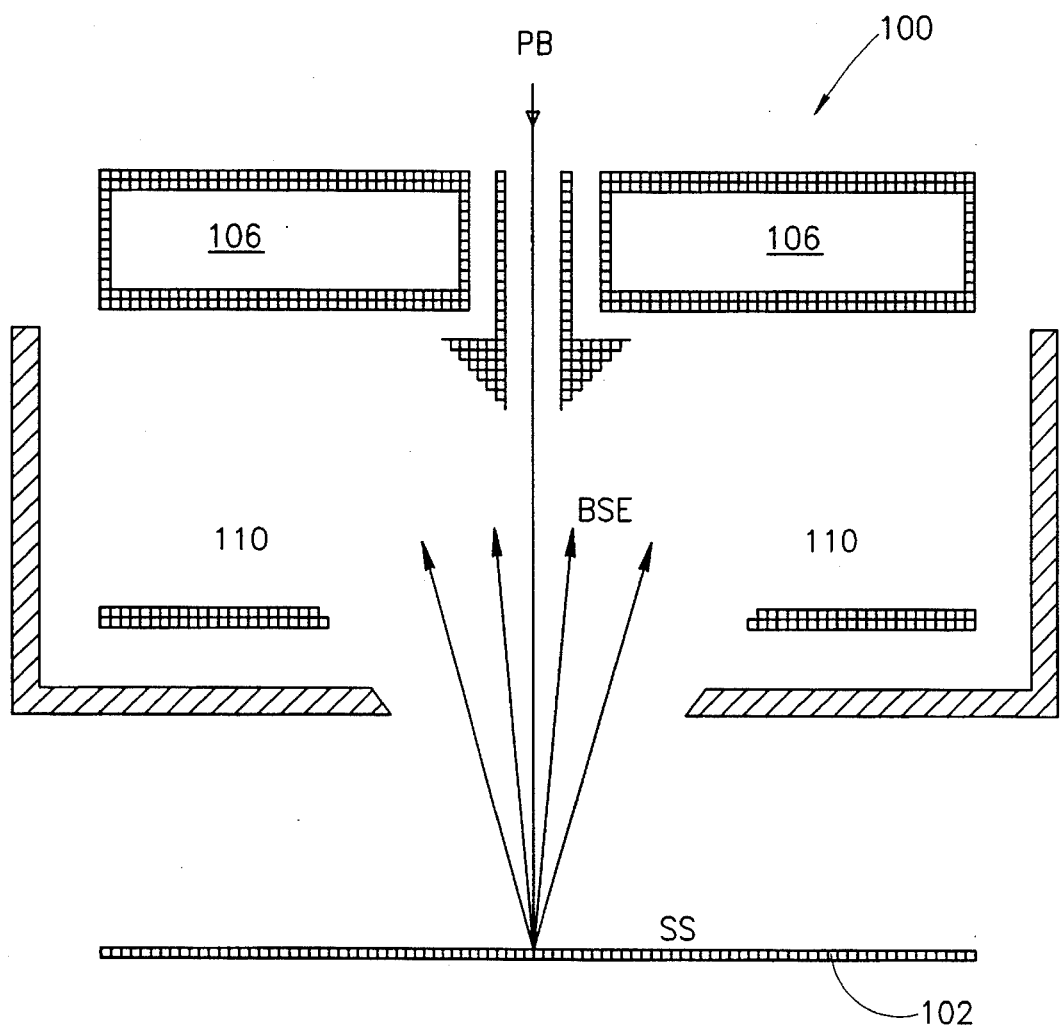
FIG. 5 is a schematic view of the electron detector including a second electrode for shielding a specimen from the electric field generated by the first electrode of the electron detector.

In certain applications, special care has to be taken to prevent the specimen from being affected by the electric field within electron detector 100 where such electric field may have deleterious effects on specimen 102 or on the functioning of other detectors in the particle beam apparatus. Shielding of specimen 102 can be achieved as shown in FIG. 5 by providing a second electrode 112 which is typically maintained at nearly the same potential as specimen 102, thereby acting as a Faraday cage to confine the electric field within electron detector 100.

As described earlier, FIG. 6 shows a second configuration in which electron detector 100 is deployed within the optical column of particle beam apparatus 102. In this case, the potentials of the elements of electron detector 100 are relative to the common potential of the optical column. The main difference between this configuration and the configuration shown in FIG. 1 is that electromagnetic lenses EL accelerate secondary electrons released from specimen 102 towards electron detector 100 through increasing their kinetic energies by several thousand electron volts such that by the time they reach electron detector 100 they behave as if they were backscattered electrons. Therefore, this configuration of electron detector 100 provides high acceptance of both BSEs and SEs.

While the invention has been described with respect to a limited number of embodiments, it will be appreciated that many variations, modifications and other applications of the invention may be made.

What is claimed is:

1. An electron detector for detecting backscattered electrons emitted from a specimen, the electron detector comprising:

(a) an electron multiplier having a front surface directed toward the specimen, said front surface releasing Type A secondary electrons on impingement of Type A backscattered electrons thereon, said Type A secondary electrons having trajectories away from said front surface; and (b) an electrode deployed between said electron multiplier and the specimen, said electrode being biased at a negative potential with respect to both said front surface and the specimen and spaced from said front surface at a distance selected so as to generate an electric field which diverts said Type A secondary electrons towards said front surface.

2. The electron detector as in claim 1, wherein said front surface is biased at a positive potential with respect to the specimen.

3. The electron detector as in claim 1, wherein said front surface is biased at a negative potential with respect to the specimen.

4. The electron detector as in claim 1, wherein said front surface is biased at substantially the same potential as the specimen.

5. The electron detector as in claim 1, wherein said electron multiplier is a microchannel plate electron multiplier.

6. The electron detector as in claim 1, wherein said electron multiplier is a solid state electron multiplier.

7. The electron detector as in claim 1, wherein said electrode has a fixed diameter aperture selected for passing therethrough a solid angle of backscattered electrons for impingement on said front surface.

8. The electron detector as in claim 1, further comprising a beam shielding tube for passage therethrough of a particle beam toward the specimen, said beam shielding tube releasing Type B secondary electrons on impingement of Type B backscattered electrons thereon, said Type B secondary electrons having trajectories away from said beam shielding tube, said electric field diverting said Type B secondary electrons towards said front surface.

9. The electron detector as in claim 8, wherein said beam shielding tube has a beveled end.

10. The electron detector as in claim 8, wherein said front surface is biased at a positive potential with respect to said beam shielding tube.

11. The electron detector as in claim 8, wherein said electrode is biased at a negative potential with respect to said beam shielding tube.

12. The electron detector as in claim 8, wherein said electrode is biased at substantially the same potential as said beam shielding tube.

13. The electron detector as in claim 1, further comprising a second electrode interposed between said first electrode and the specimen for shielding the specimen from said electric field.

14. Particle beam apparatus including an electron detector for detecting backscattered electrons emitted from a specimen as claimed in claim 1.

15. An electron detector for detecting backscattered electrons emitted from a specimen, the electron detector comprising:

(a) an electron multiplier having a front surface directed toward the specimen;

(b) a beam shielding tube for passage therethrough of a particle beam toward the specimen, said beam shielding tube releasing Type B secondary electrons on impingement of Type B backscattered electrons thereon, said Type B secondary electrons having trajectories away from said beam shielding tube; and (c) an electrode deployed between said electron multiplier and the specimen, said electrode being biased at a negative potential with respect to both said front surface and the specimen and spaced from said front surface at a distance selected so as to generate an electric field which diverts said Type B secondary electrons towards said front surface.

16. The electron detector as in claim 15, wherein said front surface releases Type A secondary electrons on impingement of Type A backscattered electrons thereon, said Type A secondary electrons having trajectories away from said front surface and said electric field diverts said Type A secondary electrons towards said front surface.

17. The electron detector as in claim 15, wherein said front surface is biased at a positive potential with respect to the specimen.

18. The electron detector as in claim 15, wherein said front surface is biased at a negative potential with respect to the specimen.

19. The electron detector as in claim 15, wherein said front surface is biased at substantially the same potential as the specimen.

20. The electron detector as in claim 15, wherein said electron multiplier is a microchannel plate electron multiplier.

21. The electron detector as in claim 15, wherein said electron multiplier is a solid state electron multiplier.

22. The electron detector as in claim 15, wherein said electrode has a fixed diameter aperture selected for passing therethrough a solid angle of backscattered electrons for impingement on said front surface.

23. The electron detector as in claim 15, wherein said beam shielding tube has a beveled end.

24. The electron detector as in claim 15, wherein said front surface is biased at a positive potential with respect to said beam shielding tube.

25. The electron detector as in claim 15, wherein said electrode is biased at a negative potential with respect to said beam shielding tube.

26. The electron detector as in claim 15, wherein said electrode is biased at substantially the same potential as said beam shielding tube.

27. The electron detector as in claim 15, further comprising a second electrode interposed between said first electrode and the specimen for shielding the specimen from said electric field.

28. Particle beam apparatus including an electron detector for detecting backscattered electrons emitted from a specimen as claimed in claim 15.

29. An electron detector for detecting backscattered electrons emitted from a specimen, the electron detector comprising:

(a) an electron multiplier having a front surface, said front surface releasing Type A secondary electrons on impingement of Type A backscattered electrons thereon, said Type A secondary electrons having trajectories away from said front surface; and (b) an electrode being biased at a negative potential with respect to said front surface and spaced from said front surface at a distance selected so as to generate an electric field which diverts said Type A secondary electrons towards said front surface.

* * * * *